(12) United States Patent
Ido

(10) Patent No.: US 6,765,400 B2
(45) Date of Patent: Jul. 20, 2004

(54) INSPECTION APPARATUS AND PROBE CARD

(75) Inventor: Yoshiyuki Ido, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 45 days.

(21) Appl. No.: 10/088,100

(22) PCT Filed: Mar. 28, 2001

(86) PCT No.: PCT/JP01/02592

§ 371 (c)(1), (2), (4) Date: Jun. 26, 2002

(87) PCT Pub. No.: WO02/09169

PCT Pub. Date: Jan. 31, 2002

(65) Prior Publication Data

US 2003/0006788 A1 Jan. 9, 2003

(30) Foreign Application Priority Data

Jul. 25, 2000 (JP) ......................................... 2000-224384

(51) Int. Cl.[7] ............................................. G01R 1/073
(52) U.S. Cl. ....................................... 324/760; 324/754
(58) Field of Search ................................ 324/760, 754, 324/757, 758, 761, 765

(56) References Cited

U.S. PATENT DOCUMENTS

| | | | | |
|---|---|---|---|---|
| 5,302,891 A | * | 4/1994 | Wood et al. | ................. 324/765 |
| 5,487,999 A | * | 1/1996 | Farnworth | .................... 216/18 |
| 5,742,169 A | * | 4/1998 | Akram et al. | ................ 324/755 |
| 5,886,535 A | * | 3/1999 | Budnaitis | .................... 324/760 |

FOREIGN PATENT DOCUMENTS

| | | |
|---|---|---|
| EP | 0 802 419 | 10/1997 |
| EP | 802419 | 10/1997 |
| EP | 841698 | 5/1998 |
| EP | 0 841 698 | 5/1998 |
| JP | 4-361543 | 12/1992 |
| JP | 6-347480 | 12/1994 |
| JP | 9-281144 | 10/1997 |
| JP | 10-322025 | 12/1998 |
| JP | 11-64377 | 3/1999 |
| JP | 11-145216 | 5/1999 |
| JP | 11-260871 | 9/1999 |
| JP | 2000-39452 | 2/2000 |
| JP | 2000-304770 | 11/2000 |

OTHER PUBLICATIONS

Patent Abstracts of Japan, JP 2000-39452, Feb. 8, 2000.
Patent Abstracts of Japan, JP 11-145216, May 28, 1999.
Patent Abstracts of Japan, JP 2000-304770, Nov. 2, 2000.

* cited by examiner

*Primary Examiner*—Ernest Karlsen
(74) *Attorney, Agent, or Firm*—Oblon, Spivak, McClelland, Maier & Neustadt, P.C.

(57) ABSTRACT

An object of the present invention is to provide an inspecting device equipped with a probe card capable of inspecting an object to be inspected appropriately even at heating or cooling time. The inspecting device of the present invention is an inspecting device equipped with a performance substrate provided with a terminal for inspection; a contactor substrate provided with a probe contacting an object to be inspected; and a probe card intervening between the probe of conductor substrate and a terminal of performance substrate, wherein the probe card is a multi-layered substrate in which a resin thin film is laminated on a ceramic board.

12 Claims, 8 Drawing Sheets

INSPECTION APPARATUS AND PROBE CARD

TECHNICAL FIELD

The present invention relates to an inspecting device equipped with a probe for judging whether or not a conductor circuit formed on a silicon wafer and the like is formed as designed, and a probe card.

BACKGROUND ART

Integrated circuits formed on a silicon wafer are inspected by pressing a probe against an inspection portion of the silicon wafer, sending electric current thereto and examining the conductivity thereof, the insulation thereof and the like. At present, with an enhancement of integration degree of a semiconductor chip, the integration degree of conductor circuits formed on the silicon wafer also is enhanced and the pitch to be inspected with probes becomes narrower. As a result, it has been becoming difficult to attach the probes directly to a head (performance substrate) of an inspecting device.

In order to cope with such a problem, a trunk substrate (probe card) is interposed therebetween and a contactor substrate on which probes are arranged is fitted to the head (performance substrate). This probe card (trunk substrate) comprises a multi-layered resin substrate, and causes wide-pitch terminals of the performance substrate and the probes, which have a narrow pitch, of the contactor substrate to be connected to each other through the probe card.

SUMMARY OF THE INVENTION

At present, the test on temperature properties of the conductor circuit is conducted in a state of a silicon wafer. That is, a silicon wafer wherein conductor circuits are formed is cooled to minus several tens of centigrade degrees. In this state, the low-temperature performance thereof is tested. Also, a silicon wafer wherein conductor circuits are formed is heated up to one hundred and several tens of centigrade degrees. In this state, the high-temperature performance thereof is tested. However, for instance, in the case of using a probe card made only of a resin in which conductor circuits are formed or a probe card made of an alumina ceramic board, the tips of probes get out of position from sites to be inspected and cannot contact the sites upon such heating/cooling time. Thus, it happens that the silicon wafer is judged to be out of order.

The present invention has been made to solve the above-mentioned problem. An object thereof is to provide an inspecting device equipped with a probe card capable of inspecting an object to be inspected even upon the time of heating/cooling, and a probe card used in this inspecting device.

The inspecting device of the present invention for attaining the above-mentioned object is an inspecting device equipped with a performance substrate provided with a terminal for inspection; a contactor substrate provided with a probe contacting an object to be inspected; and a probe card intervening between the probe of the contactor substrate and a terminal of the performance substrate, wherein the probe card is a multi-layered substrate in which a resin thin film is laminated on a ceramic board.

Since the probe card in the inspecting device of the present invention is a multi-layered substrate in which a resin thin film is laminated on a ceramic board, the thermal expansion coefficient of the entire probe card becomes close to the thermal expansion coefficient of the ceramic board and is substantially equal to the thermal expansion coefficient of a silicon wafer. For this reason, the probe card contracts thermally at a ratio similar to that of the silicon wafer at the time of heating/cooling the silicon wafer Therefore, the probe does not get out of position from a site to be inspected of the silicon wafer. Thus, appropriate inspection can be carried out.

In the above-mentioned inspecting device, the ceramic board of the above-mentioned probe card preferably comprises non-oxide ceramic.

In the case that the ceramic board of the probe card comprises non-oxide ceramic, the ceramic board has high thermal conductivity and follows a change in temperature of a silicon wafer. Thus, the ceramic board can be thermally contracted together with the silicon wafer.

In the above-mentioned inspecting device, the resin thin film preferably comprises thermosetting resin.

In the case that the resin thin film comprises thermosetting resin, the surface of the probe card can be caused to have high toughness.

The probe card of the present invention is a probe card for the use of an inspecting device for judging whether a conductor circuit formed on a silicon wafer is acceptable or defective, wherein a resin thin film and a conductor circuit are serially formed in alternate fashion and in repetition on a ceramic board having a conductor-filled through hole and the resultant conductor circuits are interconnected each other by a via hole.

In the above-mentioned probe card, the resin thin film and the conductor circuit are formed on the ceramic board having high strength; therefore, the thermal expansion coefficients of the resin thin film and the conductor circuits are dominated by the thermal expansion coefficient of the ceramic board to become substantially equal to the thermal expansion coefficient of the ceramic board and thus become substantially equal to the thermal expansion coefficient of a silicon wafer.

For this reason, the probe card also expands and contracts thermally at the same ratio as the silicon wafer does when the silicon wafer is heated/cooled. Therefore, poor connection is not caused, for example, at the portion where the probe of the contactor substrate and the conductor circuit exposed from the resin layer surface of the probe card contact each other. Thus, the conductor circuit formed on the silicon wafer can be appropriately inspected.

In the above-mentioned probe card, the ceramic board preferably comprises nitride ceramic. The resin thin film preferably comprises thermosetting resin, particularly polyimide.

This is because nitride ceramic, particularly aluminum nitride, has high thermal conductivity and follows a change in the temperature of a silicon wafer, and polyimide causes the surface of the probe card to have high toughness.

| Explanation of Symbols | |
|---|---|
| 10 | inspecting device |
| 20 | tester |
| 24 | performance substrate |
| 30 | probe |
| 40 | probe card |
| 41 | conductor-filled through hole |
| 42 | ceramic board |
| 43 | terminal pad |
| 44, 144, 244 | interlaminar resin insulating layer |
| 46, 146, 146 | via hole |
| 48, 148, 248 | conductor circuit |
| 50 | contactor substrate |
| 52 | probe |
| 60 | silicon wafer |
| 62 | pad |

DETAILED DISCLOSURE OF THE INVENTION

First, the inspecting device of the present invention will be described.

The inspecting device of the present invention is an inspecting device equipped with:

a performance substrate provided with a terminal for inspection;

a contactor substrate provided with a probe contacting an object to be inspected; and a probe card, wherein the probe card is a multi-layered substrate in which a resin thin film is laminated on a ceramic board.

This inspecting device can be classified into two kinds of inspecting devices. They are the same in that a probe card is a multi-layered substrate in which a resin thin film is laminated on a ceramic board but are different in the manner of arranging an object to be inspected.

Figure 2:
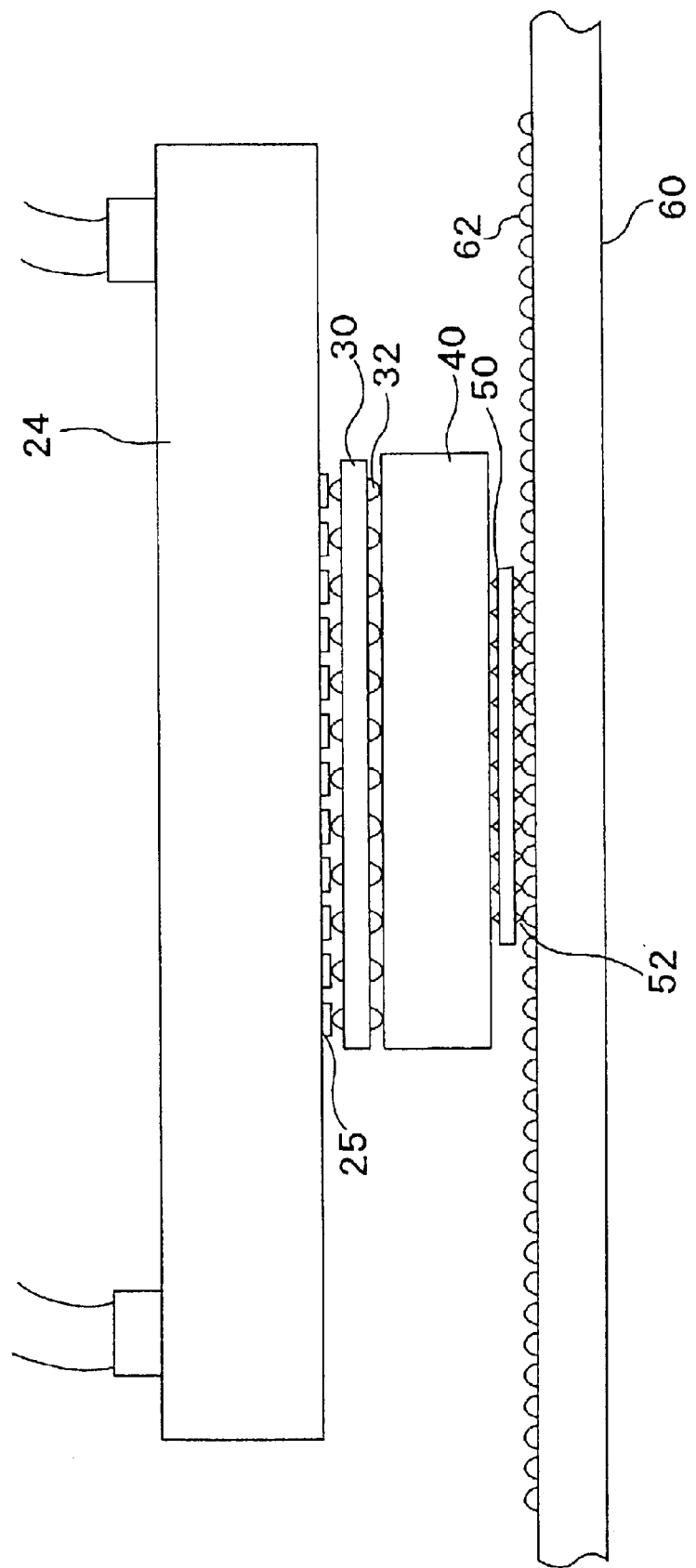
FIG. 2 is a sectional view of a probe substrate, a probe card and a contactor substrate.

That is, the first inspecting device of the present invention is, as illustrated in FIG. 2, an inspecting device equipped with: a performance substrate provided with a terminal for inspection; a contactor substrate provided with a probe contacting an object to be inspected; and a probe card intervening between the probe of the contactor substrate and a terminal of the performance substrate.

Figure 7:
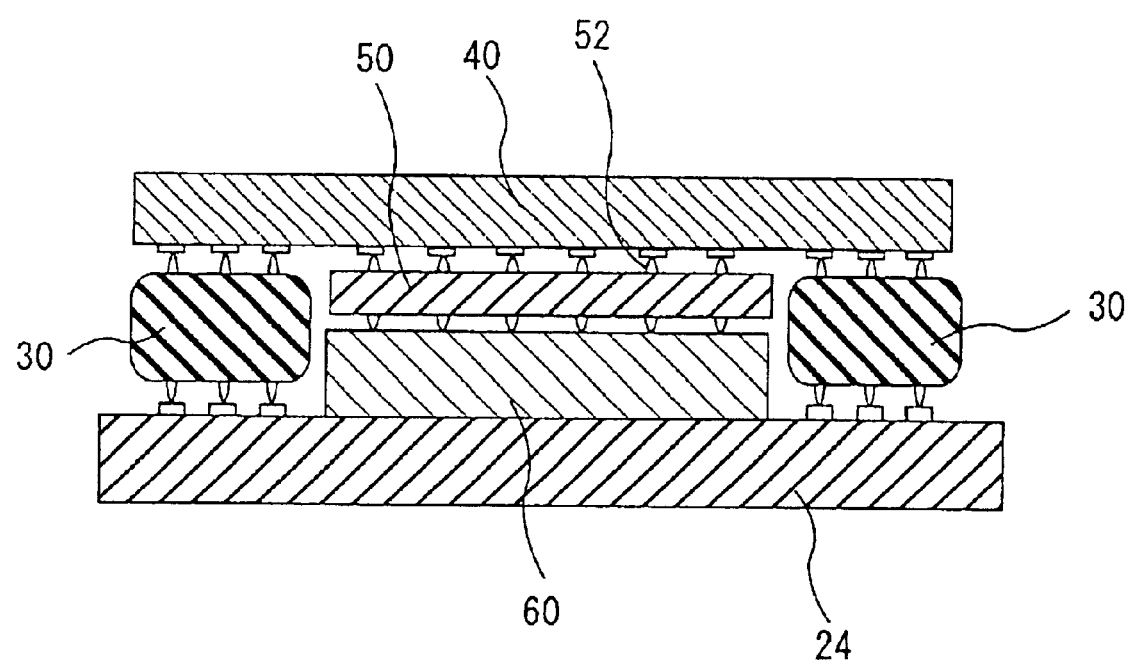
FIG. 7 is an explanatory view illustrating an embodiment in the second inspecting device of the present invention.

The second inspecting device of the present invention is, as illustrated in FIG. 7, an inspecting device equipped with: a performance substrate provided with a terminal for inspection; a contactor substrate provided with a probe contacting an object to be inspected; and a probe card electrically connected to the probe of the contactor substrate, the inspecting device being constituted such that the object to be inspected is placed between the performance substrate and the probe card.

Referring to the drawings, the first inspecting device of the present invention will first be described.

Figure 1:
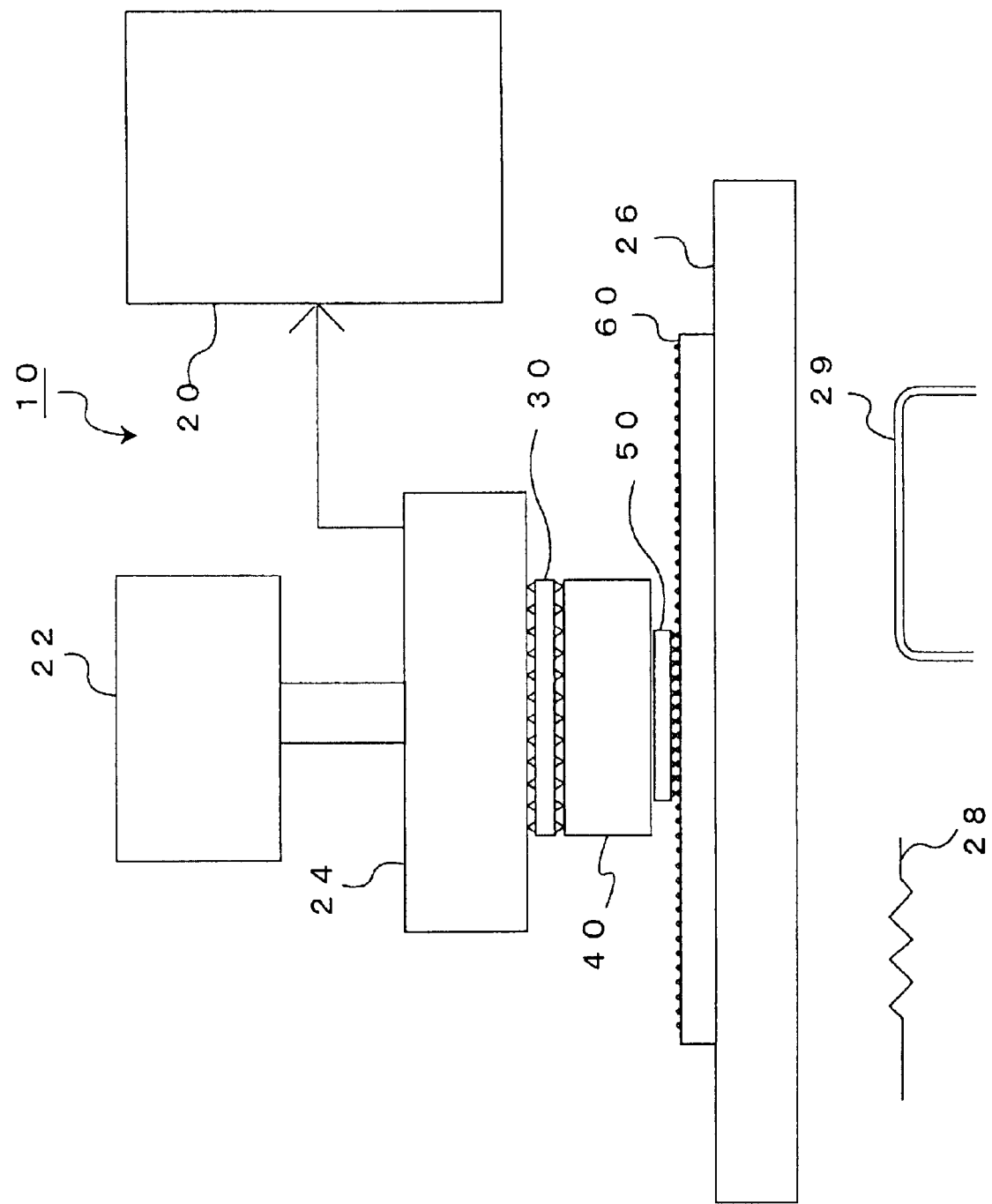
FIG. 1 is an explanatory view illustrating a first embodiment in a first inspecting device of the present invention.

FIG. 1 is a sectional view schematically illustrating a first embodiment in the first inspecting device. An inspecting device 10 is equipped with a table 26 on which a silicone wafer 60 is placed, and which adjust the position of the wafer in X, Y and Z directions, a performance substrate 24 provided with inspecting terminals, an elevating equipment 22 for adjusting the position of the performance substrate 24 in X, Y and Z directions, and a tester 20 for applying electric current through the performance substrate 24 to a silicon wafer 60 to judge whether the silicon wafer 60 is acceptable or not. Below the table 26 are arranged a heater 28 for heating the silicon wafer 26 up to 150° C. and a cooling device 29 using a Peltier mechanism for cooling the wafer to −50° C. Electric power is supplied from a non-illustrated power source to the heater 28.

Figure 3:
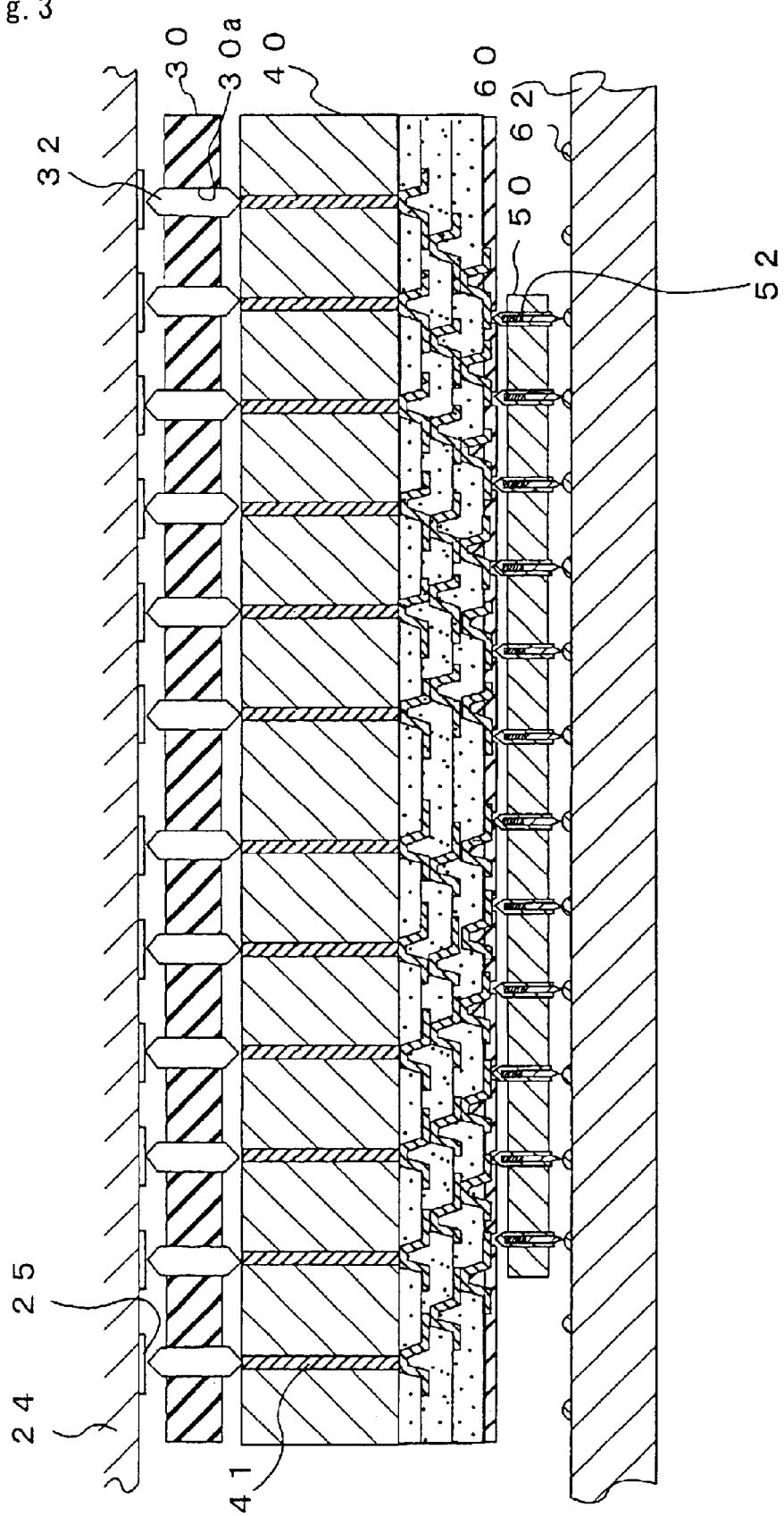
FIG. 3 is an enlarged sectional view of the probe substrate, the probe card and the contactor substrate.

FIG. 2 is an explanatory view illustrating an enlarged vicinity of the performance substrate 24. The performance substrate 24 is provided, through a probe substrate 30 and a probe card 40 which are successively arranged below it, with a contactor substrate 50 having a probe 52 which directly contacts the silicon wafer 60. Sections of the probe substrate 30, the probe card 40 and the contactor substrate 50 are shown in FIG. 3, and an enlarged portion of the probe card 40 is shown in FIG. 4.

The probe substrate 30 which connects the performance substrate 24 and the probe card 40 to each other is made of a machinable ceramic in which through holes 30a are made. Each of the through holes 30a is provided with a metal probe 32 for connecting a terminal 25 of the performance substrate 24 and a conductor-filled through hole 41 in the probe card 40 to each other.

Figure 4:
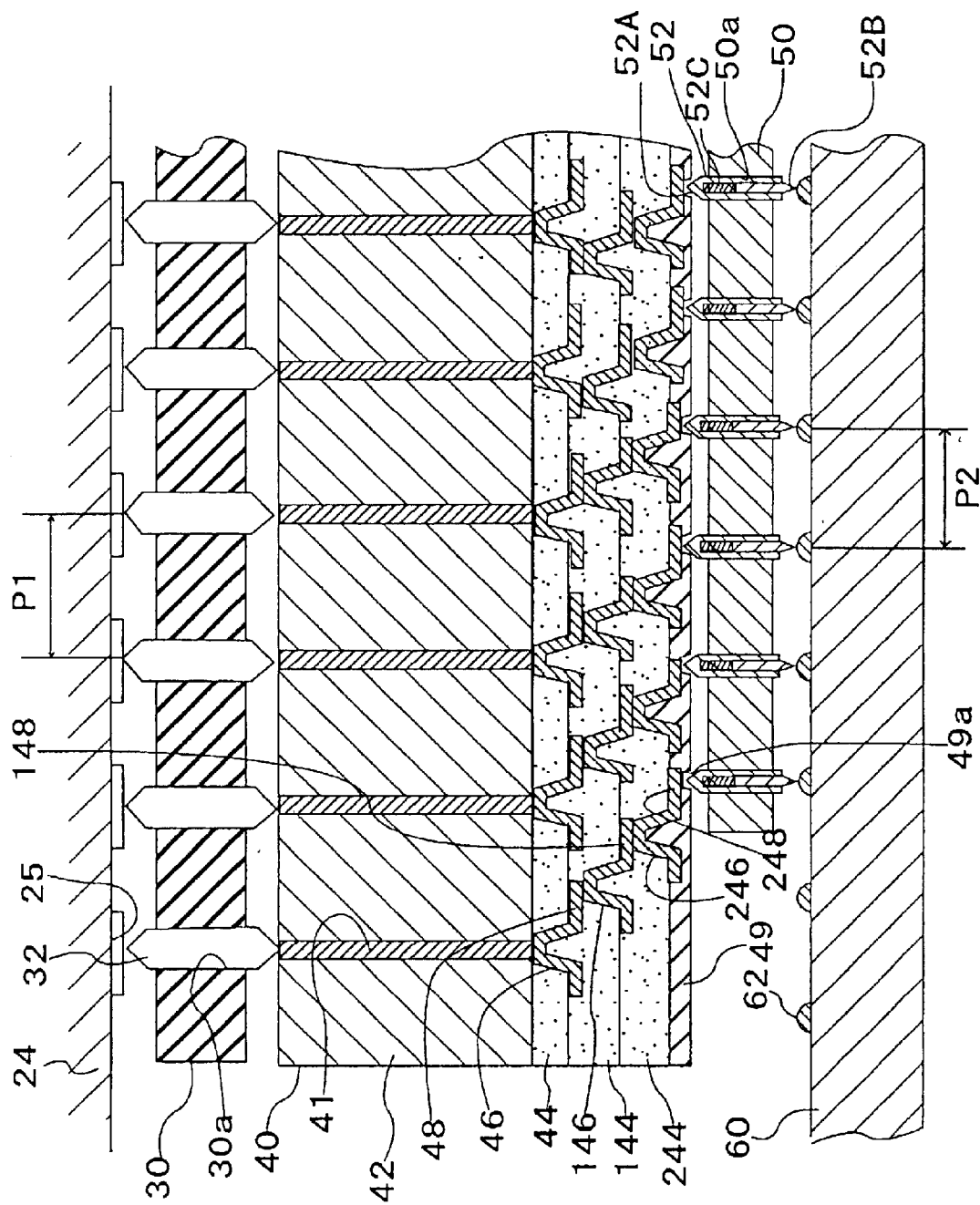
FIG. 4 is an enlarged sectional view of the probe substrate, the probe card and the contactor substrate.

As illustrated in FIG. 4, the probe card 40 comprises: a ceramic board 42 in which conductor-filled through holes 41 are formed; and interlaminar resin insulating layers (resin thin films) 44, 144 and 244 in which via holes 46, 146 and 246 and conductor circuits 48, 148 and 248 are formed. A resin layer 49 as an outermost layer, the resin thin films 44, 144 and 244 desirably are made of at least one selected from polyimide resin, epoxy resin, bismaleimide-triazine resin, benzocyclobutene, olefin resin, and Teflon resin.

The conductor circuit on the outermost surface may be covered with resin.

The conductor-filled through hole 41 formed inside the ceramic board 42 is connected to the via hole 46 formed in the interlaminar resin insulating layer 44, and the via hole 46 is connected through the conductor circuit 48 to the via hole 146 formed in the interlaminar resin insulating layer 144. Similarly, the via hole 146 is connected through the conductor circuit 148 to the via hole 246 formed in the interlaminar resin insulating layer 244.

A part of the conductor circuit 248 connected to the via hole 246 is exposed, and the upper end of the probe 52 of the contactor substrate 50 contacts the exposed conductor circuit 248 so that the terminal 25 of the performance substrate 24 and the probe 52 of the contactor substrate 50 are connected to each other through the probe card.

The thickness of the ceramic board 42 is 4 mm, and the conductor-filled through holes 41, which have a size of 60-μm square, are formed to be matched with the arrangement pitch P1 (800 μm) of the terminals 25 of the performance substrate 24.

Each of the interlaminar resin insulating layers 44, 144 and 244 is formed to have a thickness of 10 μm.

The contactor substrate 50 is made of a machinable ceramic having a thickness of 4 mm, in which through holes 50a having a diameter of 100 μm are made. The probes 52 having a diameter of 100 μm are inserted into the through holes 50a. The probes 52 are arranged to be matched with the pitch P2 (80 μm) of the inspecting pads 62 of the silicon wafer 60. The probe 52 comprises an outer probe 52A, the inside of which is formed in a cylindrical form, and an inner probe 52B. The inner probe 52B is arranged slidably inside the outer probe 52A, and is urged to move downwards (toward the silicon wafer 60) by a spring 52C.

By setting the stretching/shrinking mechanisms inside the probes 52, the inner probes 52B can be moved up and down and can be appropriately brought in contact with the pads 62 whose heights have a scattering. The probe substrate 30, the probe card 40 and the contactor substrate 50 are integrated with and fixed to the performance substrate 24 by means of a non-illustrated tool.

The following will describe inspection of the silicon wafer 60 with the first inspecting device 10 of the present invention, referring to FIGS. 1 and 4.

The silicon wafer 60 is first placed on the table 26, and a positioning mark formed on the silicon wafer is read by a non-illustrated optical device in order to adjust the position of the table 26. Thereafter, the performance substrate 24 is pressed down by the elevating equipment 22 to press the probes 52 of the contactor substrate 50 against the given pads 62 of the silicon wafer 60. In FIG. 4, the pads are drawn like heaps for convenience to illustrate sites to be measured of the silicon wafer 60. However, it should be noted that in an actual silicon wafer the pads 62 are mere specific sites on formed circuits and are not particularly heaped up.

Next, the tester 20 supplies electric current through the performance substrate 24, the probe substrate 30, the probe card 40 and the contactor substrate 50, to desired one selected from the pads 60 on the silicon wafer 60 to perform the following test at ambient temperature: property tests, for example, as to whether the given conductor circuit is conductive or not, and as to whether a portion at which insulation is required is insulated or not.

Subsequently, cooling is started by the cooling device 29, and the silicon wafer 60 is cooled to −50° C. At this time, the contactor substrate 50 made of the machinable ceramic and the ceramic board 42 of the probe card have high thermal conductivity; thus, the temperature thereof follows the change in the temperature of the silicon wafer so that they are cooled to −50° C. Incidentally, the thermal expansion coefficient of the contactor substrate 50 made of the machinable ceramic is close to that of silicon constituting the silicon wafer, and the ceramic board 42 constituting the probe card 40 is made of aluminum nitride, the thermal expansion coefficient of which is close to that of silicon. In the cooling test, therefore, the contactor substrate 50 and the probe card 40 contract to a degree similar to the contraction of the silicon wafer. For this reason, the pads 62 of the silicon wafer, the pads 52 of the contactor substrate 50, and the conductor circuits 248 of the probe card 40 do not get out of position, so that the test can be appropriately performed.

Next, electric current is sent to the heater 28, to heat the silicon wafer 60 up to 150° C. At this time, the contactor substrate 50 and the probe card 40 are also heated to about 150° C. Thus, the contactor substrate 50 and the probe card 40 expand to a degree similar to the contraction of the silicon wafer. Thus, the pads 62 of the silicon wafer, the pads 52 of the contactor substrate 50, and the conductor circuits 248 of the probe card 40 do not get out of position, so that the test can be appropriately performed. Since the interlaminar resin insulating layers 44, 144 and 244 of the probe card 40 are made of polyimide, they can keep high toughness even in a high-temperature test.

To the probe card 40, the interlaminar resin insulating layers 44, 144 and 244, which have a relatively large thermal expansion coefficient, are formed. However, the thickness of each of the interlaminar resin insulating layers is 10 $\mu$m and the total thickness of the four layers is 40 $\mu$m, whereas the thickness of the ceramic board 42 is 4 mm. Accordingly, the probe card 40 contracts and expands according to thermal contraction and thermal expansion of the ceramic board 42.

Figure 5:
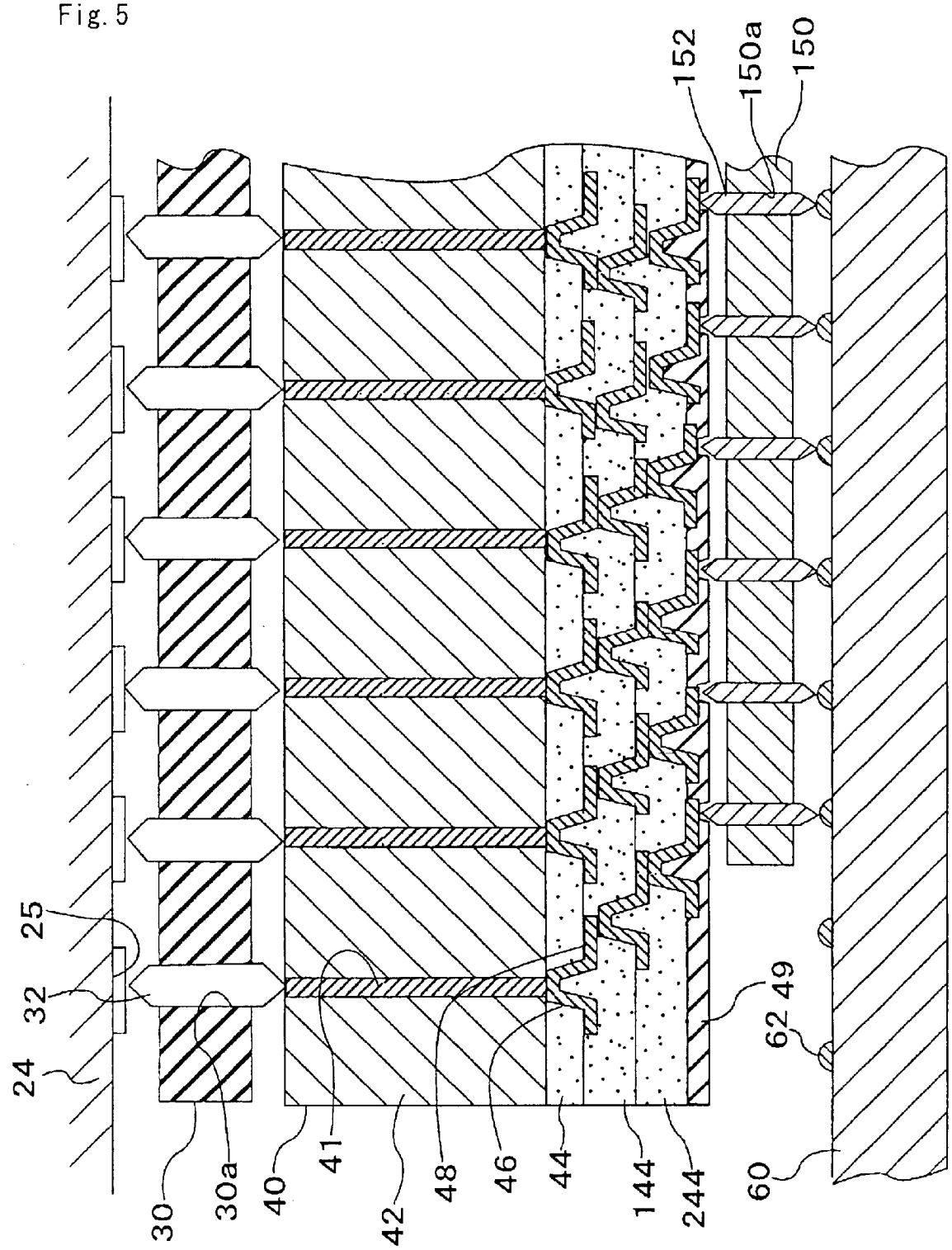
FIG. 5 is an enlarged sectional view of a probe substrate, a probe card and a contactor substrate according to a modified example of the first embodiment in the above-mentioned first inspecting device.

The following will describe a modified example of the above-mentioned first embodiment, referring to FIG. 5.

As described with reference with FIG. 4, in the contactor substrate 50, the probes 52 having therein the stretching/shrinking mechanisms are used as probes in order to perform inspection at a pitch of 80 $\mu$m.

On the other hand, in this modified example, pads 62 of a silicon wafer 60 are inspected at a pitch of 60 $\mu$m. As shown in FIG. 5, therefore, in this modified example, through holes (diameter: 25 $\mu$m) 150a are formed in a contactor substrate 150 to have a pitch of 60 $\mu$m. Probes 152 having a diameter of 20 $\mu$m are slidably inserted and fixed into the through holes 150a. That is, in this modified example, a scattering in the heights of the pads 62 can be absorbed by supporting the probes 152 slidably in the up-and-down direction.

Figure 6:
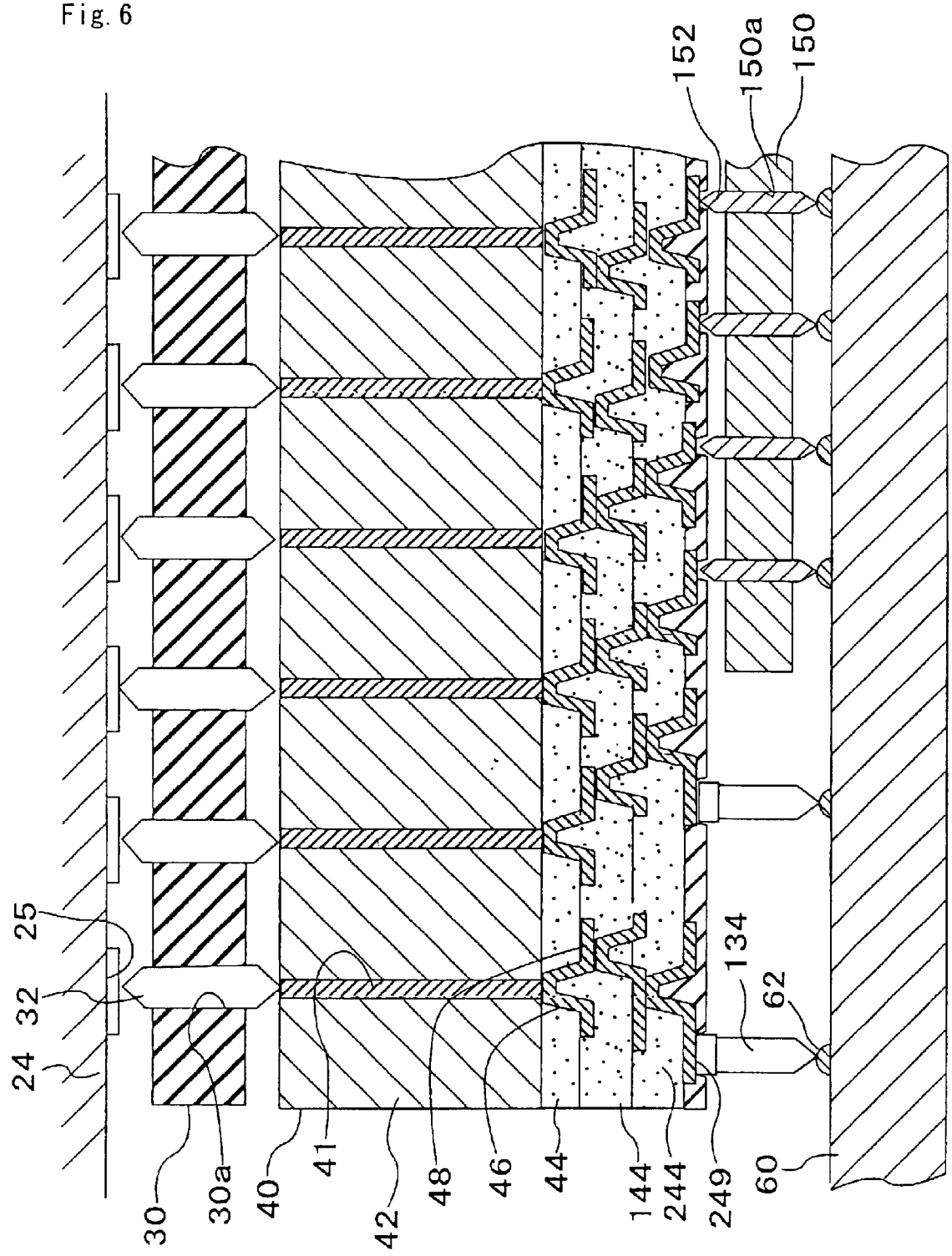
FIG. 6 is an enlarged sectional view of a probe substrate, a probe card and a contactor substrate according to a modified example of a second embodiment in the first inspecting device of the present invention.

The following will describe a second embodiment in the first inspecting device of the present invention, referring to FIG. 6.

The inspecting device according to the second embodiment has a structure similar to the inspecting device of the first embodiment described with reference to FIG. 1. In the second embodiment, however, the contactor substrate 150 is attached to only some parts of the probe card 40, that is, portions where the pads 62 are formed on the silicon wafer 60 at a very fine pitch. Electrically conductive pins (probes) 134 are attached directly to portions where the pads 62 are formed on the silicon wafer 60 at a larger pitch. The second embodiment has an advantage that the inspecting device can be produced at low costs.

The first and second embodiments are examples wherein the inspecting device of the present invention is used to inspect conductor circuits formed on a silicon wafer. Needless to say, the inspecting device of the present invention can be used to inspect an object to be inspected wherein a ceramic such as silicon is used, for instance, a semiconductor chip and the like.

FIG. 7 is a sectional view schematically illustrating a second inspecting device of the present invention. In the inspecting device of the present invention, its members may be arranged as illustrated in FIG. 7.

That is, in this inspecting device, a performance substrate 24 formed to have a size larger than a silicon wafer is arranged at the lowest side and a silicon wafer 60 is placed on the central portion of this performance substrate 24.

On the silicon wafer 60 is arranged a contactor substrate 50 having probes 52 for contacting the silicon wafer 60, and further a probe card 40 is arranged on the contactor substrate 50, so that the silicon wafer 60 and the probe card 40 are connected through the contactor substrate 50 to each other.

A probe substrate 30 is arranged around the silicon wafer 60 to cause the performance substrate 24 and the probe card 40 to be connected to each other. This probe substrate 30 is desirably formed to be in a ring form so as to have a constitution that the silicon wafer 60, which is an object to be inspected, and the contactor substrate 50 can be arranged inside the probe substrate 30.

As described above, in the second inspecting device of the present invention, the silicon wafer 60, which is an object to be inspected, and the contactor substrate 50 are arranged between the probe card 40 and the performance substrate 24.

In this inspecting device, the probe card 40 is set above the probe substrate 30 and the contactor substrate 50. Therefore, in the periphery thereof, pads for connecting to the performance substrate 24 through the probe substrate 30 are formed and, in the inner portion thereof, pads for connecting to the contactor substrate 50 are formed. The probe card 40 is desirably in a disc form.

Since this probe card 40 is set above the probe card 30 and the contactor substrate 50, the probe card 40 can contact, with only one main surface thereof, terminals of the probe substrate 30 and the contactor substrate 50. Thus, no conductor-filled through hole is necessary.

The following will describe the probe card of the present invention.

The probe card of the present invention is a probe card for the use of an inspecting device for judging whether a conductor circuit formed on a silicon wafer is acceptable or defective, wherein: a resin layer and the conductor circuit are serially formed in alternate fashion and in repetition on a ceramic board having a conductor-filled through hole; and the resultant conductor circuits are interconnected each other by a via hole.

As described above, the probe card of the present invention is a probe card for the use of an inspecting device for judging whether a conductor circuit formed on a silicon wafer is acceptable or defective. If this inspecting device is used for the above purpose, the constitution thereof is not particularly limited. An example thereof is the constitution described in the above-mentioned inspecting device.

As described above, in this probe card, a resin layer and a conductor circuit are serially formed in alternate fashion and in repetition on a ceramic board. Therefore, the positional slippage of probes and pads of the probe card is less likely to be caused by thermal expansion/contraction than in the case in which a probe card is made only of resin.

The resin layer has a lower dielectric constant than ceramics and does not cause a transmission delay of high-frequency signals, so that the resin layer makes tests using high-frequency signals possible. Since the resin layer gives toughness, the ceramic or the conductor circuit is not damaged even when the probe card is pressed against it.

Furthermore, by forming ground layers (conductor circuits in a mesh form or a plane form) as layers above and beneath the conductor circuit which constitutes a signal layer, the impedance matching of the signal layer can easily be attained. Thus, measurement can be made even in the band of high frequencies of 1 GHz or more.

Furthermore, the number of the pads can be increased, by using the resin layer to make the probe card into a multi-layered one.

In this probe card, the resin layer is desirably formed to cover the whole of at least one of the main faces of the ceramic board. For example, in JP Kokai Hei 6-140484, a resin layer is formed in portions other than the periphery of a ceramic board. In such a form, the ceramic board is distorted or cracked at the boundary between the portion where the resin layer is formed and the portion where the resin layer is not formed, upon heating or cooling. Therefore, measurement tests accompanied by heating or cooling cannot be performed.

In the ceramic board, a conductor-filled through hole may be formed.

As illustrated in FIG. 2, the probe card is allowed to be in a construction of an inspecting device by making conductor-filled through holes. Consequently, the area of the probe card can be made smaller than that of a silicon wafer, and integrated circuits formed on the silicon wafer can be tested in each of their sections.

The ceramic material of the ceramic board is not particularly limited. Examples thereof include carbide ceramics, nitride ceramics, oxide ceramics and the like.

Examples of the carbide ceramics include silicon carbide, zirconium carbide, titanium carbide, tantalum carbide, tungsten carbide and the like.

Examples of the nitride ceramics include aluminum nitride, silicon nitride, boron nitride, titanium nitride and the like.

Examples of the oxide ceramics include alumina, silica, zirconia, cordierite and the like.

Among these ceramics, non-oxide ceramics such as nitride ceramics and carbide ceramics and the like are preferred. Among these ceramics, nitride ceramics are more preferred. Aluminum nitride is particularly preferred. This is because they have a high thermal conductivity and has an excellent temperature following property as a ceramic board.

The above-mentioned ceramic board may comprise a sintering aid. Examples of the sintering aid include alkali metal oxides, alkali earth metal oxides, rare element oxides and the like. $CaO$, $Y_2O_3$, $Na_2O$, $Li_2O$ and $Rb_2O$ are preferred among these sintering aids. The content of these sintering aids is desirably from 0.1 to 20% by weight. Alumina may be contained as well.

The above-mentioned non-oxide ceramic may contains 5% or less by weight of oxygen. If the oxygen amount is about 5% by weight, sintering is promoted and an adequate breakdown voltage can be ensured. Moreover, a warp amount at high temperature can be made small.

The amount of an α-ray radiated from the surface of the non-oxide ceramic is desirably 50 c/cm²·hour or less, and is optimally 2.0 c/cm²·hour or less. This is because if the amount is more than 50 c/cm²·hour, the so-called software error is generated so that a mistake is caused in inspection.

In the ceramic board, its surface roughness Rmax based on JIS B 0601 is desirably: $0.01\ \mu m < Rmax < 100\ \mu m$. Its Ra is desirably: $0.001 < Ra < 10\ \mu m$.

In the ceramic board, its surface roughness is optimally: Ra=0.01 to 10 μm according to JIS B 0601. This is because a larger surface roughness is preferable in light of adhesion of the surface to the conductor circuit; however, an excessively large surface roughness makes measurement using high frequencies difficult by skin effect (signal current having a high frequency flows locally in the surface of the conductor circuit), and further a small surface roughness causes a problem about the adhesion.

The shape of the ceramic board is not particularly limited. Preferably, the shape is a rectangular solid shape (rectangular shape in plan view), a polygonal column shape, a disc shape and the like. The length of its diameter or longest diagonal line is preferably from 10 to 500 mm.

The thickness of the ceramic board is preferably 50 mm or less, and more preferably 10 mm or less. This is because if the thickness of the ceramic board is too thick, the device cannot be made small-sized and further its heat capacity becomes large so that temperature-rising/dropping speed drops and temperature-matching property deteriorates. By making the thickness of the ceramic board thin, the electric resistance of the probe card can be made small so that erroneous decision can be prevented from being generated.

The flatness of the ceramic board is preferably 500 μm or less when the distance measured is (the diameter—10 mm) or (the longest diagonal line length—10 mm). This is because if the flatness is more than 500 μm, no warp can be corrected even by pressing upon measurement.

The thermal conductivity κ of the ceramic board is preferably $10\ W/m \cdot k < \kappa < 300\ W/m \cdot k$, and more preferably from 160 to 220 W/m·k.

This is because by making the thermal conductivity high, the temperature-rising/dropping speed becomes large so that the temperature of the ceramic board rapidly becomes equivalent to that of an object to be measured, such as a silicon wafer, and the slippage thereof from the probes of the contactor substrate can be prevented.

The volume resistivity p of the ceramic board is desirably $10^{13}\ \Omega \cdot cm < \rho < 10^{16}\ \Omega \cdot cm$. This is because the generation of leakage current at high temperature and dielectric breakdown between the conductor-filled through holes are prevented.

The Young's module E of the ceramic board is desirably 60 GPa<E<450 GPa at 25 to 600° C. This is because the ceramic board is prevented from being warped at high temperature.

The bending strength $\sigma_f$ of the ceramic board is desirably 200 MPa<$\sigma_f$<500 MPa at 25 to 600° C. This is because the ceramic board is prevented from being damaged when the ceramic board is pressed. When the ceramic board is pressed, a pressure of about 0.1 to 10 kg/cm² is applied to the ceramic board.

The porosity of the ceramic board is desirably 5% or less. The pore diameter of the maximum pore is desirably 50 µm or less. This is because an adequate breakdown voltage can be ensured at a temperature of 100° C. or more, large mechanical strength can be obtained, and the warp amount of the ceramic board upon being pressed can be made small.

Additionally, the thermal conductivity becomes high and temperature-rising/dropping is rapidly attained, thereby causing excellent temperature-matching.

About the maximum pore, ten arbitrary positions are photographed with an electron microscope, the largest pore is selected in each visual field, and the average value of the maximum pore diameters thereof is defined as the pore diameter of the maximum pore. The porosity may be 0%. The matter that no pores are present is ideal.

If the porosity is more than 50 µm, it becomes difficult to ensure a high breakdown voltage property particularly at high temperature so that a short circuit and the like may be caused.

The pore diameter of the maximum pore is desirably 10 µm or less. This is because the warp amount becomes small at high temperature (for example, 100° C. or more).

The porosity is measured by Archimedes' method. This is a method of crushing a sintered body to pieces, putting the pieces into an organic solvent or mercury to measure the volume thereof, obtaining the true specific gravity of the pieces from the weight and the volume thereof, and calculating the porosity from the true specific gravity and apparent specific gravity.

The porosity and the pore diameter of the maximum pore are adjusted by pressing time, pressure and temperature at the time of sintering, or additives such as SiC and BN. Since SiC or BN obstructs sintering as described above, pores can be produced. When pores are present, the toughness value rises. Therefore, pores may be present to such a degree that the strength does not drop very much.

When pores are present inside the ceramic board, the pores are preferably closed pores. The quantity of helium (helium leakage quantity) passing through the ceramic board is desirably $10^{-7}$ Pa·m$^3$/sec. or less. This is because by making the ceramic board which has small value of the helium leakage quantity and which is fine and condensed, conductor-filled through holes made inside can be prevented from being corroded by oxygen and so on in the air.

A scattering in the thickness of the ceramic board is preferably within ±3%. This is because it is necessary that the surface of the ceramic board is flat in order that poor contact between the ceramic board and the probes of the contactor substrate is not caused.

A scattering in the thermal conductivity is preferably within ±10%. This is because warp and so on, resulting from unevenness in the temperature, can be prevented.

The brightness of the ceramic board is desirably N6 or less as a value based on the rule of JIS Z 8721. The ceramic board having such a brightness has concealing property to have good external appearance, and further has a large radiant heat capacity so that the temperature of the ceramic board rises rapidly.

The brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

The ceramic board having such properties can be obtained by incorporating 100 to 5000 ppm of carbon into the ceramic board. Carbon is classified into amorphous carbon and crystalline carbon. The amorphous carbon makes it possible to suppress a drop in the volume resistivity of the ceramic board at high temperature, and the crystalline carbon makes it possible to suppress a drop in the thermal conductivity of the ceramic board at high temperature. Therefore, the kind of carbon can be appropriately selected dependently on the purpose of the substrate to be manufactured, and so on.

The amorphous carbon can be obtained by firing, for example, a hydrocarbon made only of C, H and O, preferably a saccharide in the air. As the crystalline carbon, graphite powder and the like can be used.

Carbon can be obtained by decomposing an acrylic resin thermally in an inert atmosphere and then heating and pressing the resin. By changing the acid value of this acrylic resin, the degree of crystallinity (amorphousness) can also be adjusted.

The probe card of the present invention is usually constituted in the same manner as the probe cards illustrated in FIGS. 3 to 6, and conductor-filled through holes are made inside their ceramic board. The conductor-filled through holes are made of a high melting point metal such tungsten or molybdenum, or a electrically conductive ceramic such as tungsten carbide or molybdenum carbide.

The diameter of the conductor-filled through holes is desirably from 0.1 to 10 mm. This is because disconnection is prevented and further cracks and strain can be prevented. The shape of the conductor-filled through holes is not particularly limited. Examples thereof include a circular column shape, rectangular column shapes (such as a square column and a circular column) and the like.

In the probe card of the present invention, a conductor circuit for enlarging the pitch of wirings may be formed inside the ceramic board or on the surface thereof so as to be in parallel to main faces of the ceramic board. A terminal pad for connection to the probe 32 of the probe substrate maybe formed. By forming the conductor circuit, the enlargement degree of the pitch in the resin layer can be made small and the formation of the conductor circuit becomes easy. The conductor circuit may be formed only on one main face of the probe card. The conductor circuit or the terminal pad preferably comprises a high melting point metal such tungsten, molybdenum and the like or a electrically conductive ceramic such as tungsten carbide, molybdenum carbide and the like.

The case may be, however, this conductor layer may be made of a noble metal such as gold, solver, platinum and the like, or a metal such as nickel and the like.

The area resistivity of the conductor-filled through holes, the conductor circuit, the terminal pad and the like is preferably from 1 to 50 µΩ/□.

If the area resistivity is more than 50 µΩ/□, the conductor-filled through holes and the like may generate heat or the inspecting device may make an erroneous decision by a drop in voltage and the like.

In order to form the conductor-filled through holes or the conductor circuits on the surface of the ceramic board or inside it, it is preferable to use a conductor containing paste comprising a metal or a electrically conductive ceramic.

In other words, in the case that the conductor-filled through holes or the conductor circuits are formed inside the ceramic board, through holes made in a green sheet are filled with a conductor containing paste or a conductor containing paste layer is formed on a green sheet; thereafter, such green sheets are laminated and fired, thereby forming the conductor-filled through holes or the conductor circuits inside the ceramics substrate.

By forming a conductor containing paste layer on a green sheet which will be a topmost layer or a lowermost layer and then firing this layer, the conductor circuits can be formed on the surface of the ceramic board.

On the other hand, after the ceramic board is manufactured, by forming a conductor containing paste layer on the surface thereof and firing this layer, the conductor circuits or the terminal pads can be formed.

The conductor containing paste is not particularly limited, and is preferably a paste comprising not only metal particles or electrically conductive ceramic particles for keeping electrical conductivity but also a resin, a solvent, a thickener and so on.

The material of the metal particles or the electrically conductive ceramic particles may be the same as described above. The particle diameter of these metal particles or electrically conductive ceramic particles is preferably from 0.1 to 100 μm. If the particle diameter is too fine, that is, less than 0.1 μm, they are easily oxidized. On the other hand, if the particle diameter is over 100 μm, they are not easily sintered so that the resistance value becomes large.

The shape of the metal particles may be spherical or scaly. When these metal particles are used, they may be a mixture of the spherical particles and the scaly particles.

In the case that the metal particles are scaly or a mixture of spherical particles and scaly particles, metal oxides between the metal particles are easily held and adhesion between the conductor circuits etc. and the ceramic board is made sure. Thus, this case is profitable.

Examples of the resin used in the conductor containing paste include epoxy resin, phenol resin and the like. Examples of the solvent are isopropyl alcohol and the like. Examples of the thickener are cellulose and the like.

When the conductor containing paste layer is formed on the surface of the ceramic board, it is preferable to add a metal oxide besides the metal particles to the conductor containing paste and make a sintered body of the metal particles and the metal oxide. By sintering the metal oxide together with the metal particles in this way, the ceramic board can be more closely adhered to the metal particles, etc.

The reason why the adhesion to the ceramic board by mixing the metal oxide is improved is unclear, but would be based on the following. The surface of the metal particles, or the surface of the ceramic board made of the non-oxide is slightly oxidized so that an oxidized film is formed. Pieces of this oxidized film are sintered and integrated with each other through the metal oxide so that the metal particles and the ceramic are closely adhered to each other. In the case that the ceramic constituting the ceramic board is an oxide, the surface is naturally made of the oxide. Therefore, a conductor layer having superior adhesion is formed.

A preferred example of the above-mentioned metal oxide is at least one selected from the group consisting of lead oxide, zinc oxide, silica, boron oxide ($B_2O_3$), alumina, yttria, and titania.

This is because these oxides make it possible to improve adhesion to the metal particles etc. and the ceramic board.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The weight ratio is preferably adjusted within the scope that the total thereof is not over 100 parts by weight.

By adjusting the amounts of these oxides within these ranges, particularly adhesion to the ceramic board can be improved.

On the ceramic board having the above-mentioned constitution, a resin thin film (interlaminar resin insulating layer) and a conductor circuit are serially formed in alternate fashion and in repetition. Layers in which the resultant conductor circuits are interconnected each other by a via hole (hereinafter referred to as laminated resin layers) are formed.

The resin which constitutes the interlaminar resin insulating layer (resin thin film) is preferably a resin having excellent heat resistance. Examples of such a resin having excellent heat resistance include epoxy resin, polyimide resin, bismaleimide resin, cardo type polymer and the like. These are desirably sensitized. Also, epoxy resin, polyimide resin and so on are desirably sensitized. Considering easiness of the formation of a thin film, mechanical properties, and adhesion to the ceramic board 42, cardo type polymer, polyimide resin and so on are preferable.

The cardo type polymer is a general term of polymers having a structure wherein a cyclic group is directly bonded to its polymer main chain. The cardo type polymer causes phenomena such as rotation-restriction of the polymer main chain, conformation-restriction of the main chain and side chains, blocking of intermolecular packing, and an increase in aromaticity based on introduction of an aromatic substituent to the side chains, which result from the structure of the cardo type polymer, that is, the matter that a bulky substituent is present perpendicularly to the main chain. Therefore, the glass transition temperature thereof is high after it is cured.

Also, in the cardo type polymer having such a structure, the moving ability of the main chain is suppressed because of its bulky substituent. Thus, even the cardo type polymer which is cured at less than 300° C. has a high crosslink density and a superior heat resistance. Moreover, the cardo type polymer has a superior solvent-solubility since the bulky substituent blocks close contact of molecular chains.

The cardo type polymer can be yielded by copolymerizing a cyclic compound having a carbonyl group (ketone, ester, acid anhydride, imide and the like) and an aromatic compound such as phenol or aniline, or a derivative thereof by condensation reaction.

The above-mentioned photosensitive cardo type polymer is a cardo type polymer having photosensitivity among the cardo type polymers having the above-mentioned structure. A specific example thereof is a photosensitive cardo type polyester yielded by copolymerizing a compound represented by the following chemical formula (1):

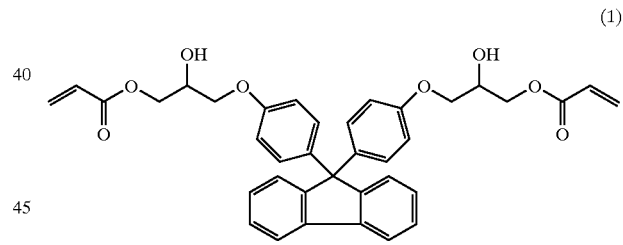

(1)

and at least one selected from a compound represented by the following general formula (2);

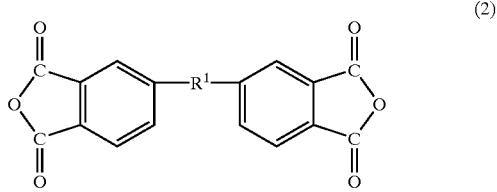

(2)

(In the formula, $R^1$ represents oxygen, a carbonyl group, a tetrafluoroethylene group, or a single bond), pyromellitic dianhydride, terephthalic acid, and an acid chloride thereof.

Another example is a photosensitive cardo type polyimide yielded by copolymerizing a compound represented by the above-mentioned general formula (1) and at least one selected from a compound represented by the following general formula (3);

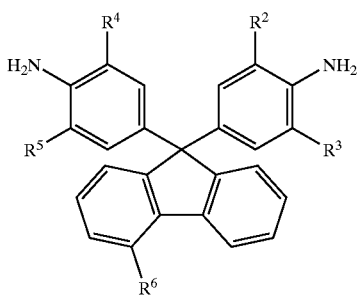

(3)

(wherein $R^2$, $R^3$, $R^4$ and $R^5$, which may be the same or different, each represents hydrogen, or a hydrocarbon group having 1 to 5 carbon atom(s), and $R^6$ represents hydrogen, a carboxyl group, an alkoxycarbonyl group having 2 to 8 carbon atoms), a compound represented by the above-mentioned general formula (2), pyromellitic dianhydride, terephthalic acid, and an acid chloride thereof.

Among these compounds, the photosensitive cardo type polyimide resin is desirable. This is because even if this resin turns to a cured body by curing at relatively low temperature, the glass transition temperature thereof is high.

The glass transition temperature of the cured photosensitive cardo type polymer is desirably from 250 to 300° C. This is because: since any glass transition temperature within the above-mentioned range can be attained by curing the photosensitive cardo type polymer at a curing temperature of about 200° C., bad effects (such as softening of the resin substrate, dissolution thereof and the like) are not produced on the resin substrate when the interlaminar resin insulating layer is formed. Furthermore, the formed interlaminar resin insulating layer is superior in shape-keeping capability and heat resistance.

In the case that the laminated resin layers are formed using such a resin, for example, after application of a photosensitive polyimide resin to the manufactured ceramic board 42, through holes for via holes, which reach the conductor-filled through holes 41, are made by exposure and development treatment and then the polyimide resin is heated and cured.

Examples of the method of the application include spin coating, roll coater, dipping and curtain coater methods, and the like. The spin coating is preferable since a film having an even thickness can be relatively easily formed.

By forming the resin layer two times to form overlapping layers, the generation of pinholes can be more surely prevented. The via holes may be made by radiation of a laser ray.

Before the resin layers are formed on the ceramic board, the conductor circuit may be formed on the surface of the ceramic board. This is because by forming the conductor circuit on the surface of the ceramic board, the interval between the wirings formed on the other main face can be made wide.

After the formation of the conductor circuit on the interlaminar resin insulating layer having the through holes for via holes, which are formed through the above-mentioned steps, etching and the like is performed, thereby forming the via holes 46 and the conductor circuits 48, as illustrated in, for example, FIG. 4.

The material of the conductor circuits 48 is not particularly limited if the electric conductivity thereof is high. Examples thereof include copper, chromium, nickel, zinc, gold, silver, tin, iron and the like. Among these metals, copper, which is relatively easily treated with plating or enables the formation of circuits having a high electric conductivity, is preferable.

Before the formation of the conductor layer on the interlaminar resin insulating layer, the surface of the interlaminar resin insulating layer is preferably subjected to modification treatment in order to ensure adhesion between the interlaminar resin insulating layer and the conductor layer.

Examples of the method of modifying the interlaminar resin insulating layer include a method of using oxygen plasma to perform plasma etching, and a method of using corona discharge and the like. For example, by performing plasma treatment, hydroxyl groups are formed on the surface to improve the adhesion.

Thereafter, the conductor circuit is formed on the interlaminar resin insulating layer. At this time, a conductor layer in, so-called, a spread state is formed on the entire interlaminar resin insulating layer and subsequently an etching resist is formed thereon. Thereafter, the conductor circuit is formed by performing etching.

Examples of the method of forming such a conductor circuit in a spread state include plating methods such as electroless plating and electroplating, sputtering, vapor deposition, CVD and the like. Among these methods, sputtering and plating are preferable. Sputtering and plating may be used together. This is because: the conductor layer having excellent adhesion can be formed on the surface of the interlaminar resin insulating layer by sputtering; and the conductor layer having a relatively large thickness can be formed by electroplating.

By repeating the above-mentioned treatment plural times, the interlaminar resin insulating layer and the conductor circuit are serially laminated and formed in repetition, laminated resin layers wherein the resultant conductor circuits are connected to each other through the via holes can be formed.

By making through holes in the topmost resin layer, some parts of the conductor circuit are made exposed so as to enable contact with the probes of the contactor substrate 50 arranged below it. The conductor circuit may be made exposed without forming any resin layer on the conductor circuit, as it is.

Figure 8:
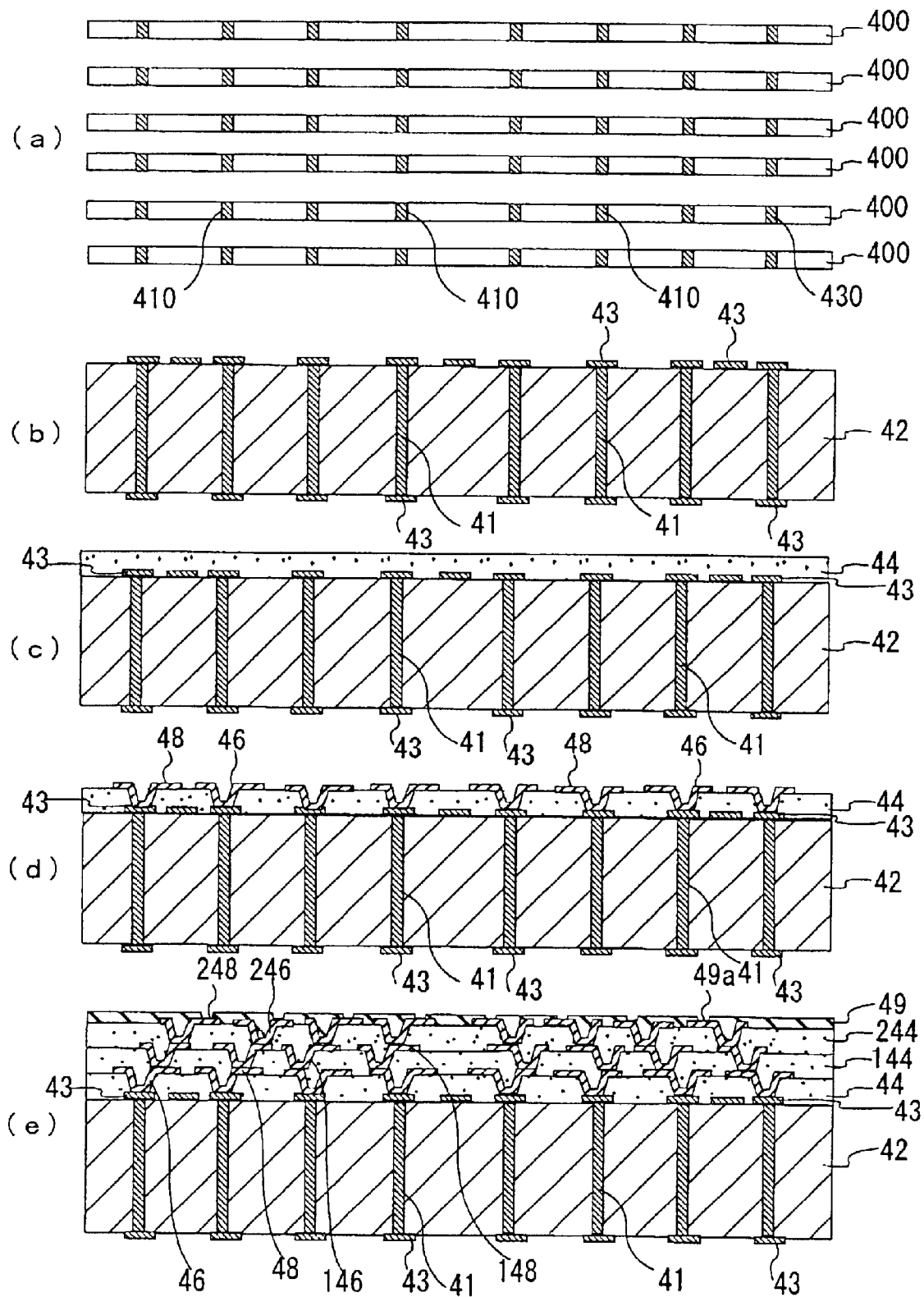
FIGS. 8(a) to (e) are sectional views illustrating some parts of the manufacturing process of a probe card of the present invention.

On the basis of FIG. 8, the following will describe a process of manufacturing the probe card of the present invention. About the manufacture of the ceramic board constituting the above-mentioned probe card, other manufacturing processes thereof can be supposed. Thus, the present method, referred to herein, is called the manufacturing process A.

(1) Step of Forming Green Sheets

First, powder of a nitride ceramic or an oxide ceramic is mixed with a binder, a solvent and so on to prepare a paste. This is used to produce green sheets.

As the above-mentioned ceramic powder, aluminum nitride, and the like can be used. If necessary, a sintering aid such as yttria may be added. When the green sheets are produced, crystalline or amorphous carbon may be added.

As the binder, desirable is at least one selected from an acrylic binder, ethylcellulose, butyl cellosolve, and polyvinyl alcohol.

As the solvent, desirable is at least one selected from α-terpineol and glycol.

A paste obtained by mixing these is formed into a sheet form by doctor blade process, to produce green sheets 400.

The thickness of the green sheets 400 is preferably from 0.1 to 5 mm.

Next, portions which will be through holes for constituting conductor-filled through holes, and so on are formed in the resultant greens sheet if necessary. After a green sheet lamination that will be described later is formed, the above-mentioned processing may be performed.

(2) Step of Printing a Conductor Containing Paste on the Green Sheets

A conductor containing paste is filled into the portions which will be conductor-filled through holes, to prepare filled layers 410. If necessary, the above-mentioned conductor containing paste is used to form a conductor containing paste layer 420, which will be pads, on portions of the topmost green sheet, that is, where the filled layers for conductor-filled through holes are formed. The layer which will be pads may be formed by sputtering and the like after producing a ceramic board.

In the case that conductor circuits are formed inside, it is fine to form conductor containing paste layers on the green sheets which will be inner layers.

These conductor containing pastes contain metal particles or electrically conductive ceramic particles. Examples of the material of the metal particles include tungsten or molybdenum and the like, and examples of the electrically conductive ceramic include tungsten carbide or molybdenum carbide.

The average particle diameter of tungsten particles or molybdenum particles, which are the above-mentioned metal particle, is preferably from 0.1 to 5 $\mu$m. This is because if the average particle is: less than 0.1 $\mu$m; or more than 5 $\mu$m, the conductor containing paste is not easily printed.

Such a conductor containing paste may be a composition (paste) obtained by mixing, for example, 85 to 87 parts by weight of the metal particles or the electrically conductive ceramic particles; 1.5 to 10 parts by weight of at least one binder selected from acrylic binders, ethylcellulose, butyl cellosolve and polyvinyl alcohol; and 1.5 to 10 parts by weight of at least one solvent selected from α-terpineol and glycol.

(3) Step of Laminating the Green Sheets

Next, the green sheets 400 are laminated, and are pressed to form a lamination (reference to FIG. 8(*a*)).

(4) Step of Firing the Green Sheet Lamination

Next, the green sheet lamination is heated and pressed to sinter the green sheets 400 and the metals, etc. in the inner and outer conductor containing pastes. Thus, a ceramic board 42 having conductor-filled through holes 41 etc. is manufactured.

Heating temperature is preferably from 1000 to 2000° C., and pressing pressure is preferably from 10 to 20 MPa. The heating is performed in the atmosphere of an inert gas. As the inert gas, for example, argon or nitrogen and the like can be used.

(5) Next, conductor layers are formed on both surfaces of the ceramic board 42 obtained through the above-mentioned steps by sputtering, plating and the like method using a metal such as titanium, molybdenum, nickel, chromium and the like.

Furthermore, an etching resist is formed by photolithography. Next, some parts of the conductor layers are dissolved by an etching solution, to strip the etching resist. In this way, a conductor circuit 43 is formed (reference to FIG. 8(*b*)). The thickness of the conductor circuit 43 is preferably from 1 to 10 $\mu$m.

It is desirable to form a non-oxidizable metal layer (not illustrated) made of such as a nickel or noble metal (gold, platinum, silver or palladium) layer on the surface of the conductor circuit 43 on the side where no resin layer is formed by electroless plating. The thickness of the non-oxidizable metal layer is preferably from 1 to 10 $\mu$m.

(6) An interlaminar resin insulating layer 44 is formed on at least one of the surfaces (reference to FIG. 8(*c*)). The resin is desirably a photosensitive resin. Among them, acrylated epoxy resin or acrylated polyimide resin is preferable. The interlaminar resin insulating layer 44 may be formed by laminating resin films or spin-coating liquid resin.

(7) After the formation of the resin layer, the resultant is heated and dried. Next, the resultant is exposed to light and developed to make openings. Furthermore, liquid resin is again spin-coated, and then the resultant is heated and dried. Next, the resultant is exposed to light and developed, to make openings. The reason why the single interlaminar resin insulating layer 44 is formed by the operations divided into two is that even if pinholes are made in one of the resin layers, insulation can be ensured by the other resin layer.

It is allowable to fill resin into spaces between the conductor circuit pieces formed on the surface of the ceramic board and remove irregularities resulting from the conductor circuits, thereby making the surface flat. The openings may be made by a laser.

(8) Next, the resin layer surface is subjected to modification treatment such as oxygen plasma treatment. Since hydroxyl groups are formed on the surface, adhesion thereof to metal is improved.

Next, chromium, copper and the like is sputtered. The thickness of the sputtering layer is preferably from 0.1 to 5 $\mu$m. Next, a plating resist is formed by photolithography, and then a Cu or Ni layer is formed by electroplating. The thickness thereof is desirably from 2 to 10 $\mu$m.

Thereafter, the plating resist is stripped, and etching is performed, thereby dissolving and removing the conductor layer used to be beneath the plating resist. Thus, a conductor circuit 48 having the via holes 46 is formed (reference to FIG. 8(*d*)).

Thereafter, by repeating the above-mentioned steps (6) to (8), a probe card is manufactured, wherein interlaminar resin insulating layers 44, 144, 244 and 49 and conductor circuits 48, 148 and 248 (including the via holes 46, 146 and 246) are laminated and formed on the ceramic board (reference to FIG. 8(*e*)). When conductor circuit and the resin layer are formed on the ceramic board, the conductor circuit (resin layer) may be formed as a monolayer, or as a two or more layers as illustrated in FIG. 8.

Incidentally, in the via holes 46 as illustrated in FIG. 8(*d*), the conductor layers having substantially the same thickness are formed along the openings for the via holes. It is however allowable to make the so-called filled vias having a flat shape, wherein metal is substantially filled into the openings for the via holes and the upper faces of the via holes 46 are at a level substantially equivalent to the level of the conductor circuits 48.

When a ceramic board is manufactured, the following manufacturing process (hereinafter referred to as the manufacturing process B) may be adopted besides the above-mentioned manufacturing process.

(1) If necessary, a sintering aid such as yttria, a binder and so on are blended with the above-mentioned nitride ceramic or carbide ceramic powder, to prepare a slurry. Thereafter, this slurry is made into a granular form by spray-drying and the like. The granule is put into a mold and pressed to be formed into a plate form and the like form. Thus, a raw formed body (green) is formed.

Next, the raw formed body is pre-fired at a temperature of 600 to 1600° C., to make through holes, which will be conductor-filled through holes, with a drill and the like.

(2) Step of Printing a Conductor Containing Paste on the Substrate

A conductor containing paste is generally a fluid comprising metal particles, an electrically conductive paste or a mixture thereof; a resin; and a solvent, and has a high viscosity. This conductor containing paste is printed on conductor circuit portions and conductor-filled through hole portions by screen printing and the like, to form a conductor containing paste layer and conductor-filled through holes.

The conductor circuits may be formed after the end of the sintering step (3), which will be described below.

(3) Next, this pre-fired body is heated and fired to be sintered. In this way, a plate made of the ceramic is manufactured. Thereafter, by working the plate into a desired shape, a substrate is manufactured. The raw formed body may be made to have such a shape that the body after firing can be used as it is. By heating and firing the formed body under pressure, a substrate having no pores can be manufactured. It is enough if the heating and firing is performed at the sintering temperature or higher. The temperature is from 1000 to 2500° C. for nitride ceramics or carbide ceramics.

BEST MODES FOR CARRYING OUT THE INVENTION

The following will describe the present invention in more detail by way of Examples. The present invention is not however limited to these examples.

EXAMPLE 1

Manufacture of a Probe Card (Reference to FIG. 8)

(1) The following paste was used to conduct formation by a doctor blade method, to obtain green sheets 400 having a thickness of 0.47 mm: a paste obtained by mixing 100 parts by weight of aluminum nitride powder (made by Tokuyama Corp., average particle diameter: 1.1 $\mu$m), 4 parts by weight of yttria ($Y_2O_3$, average particle diameter: 0.4 $\mu$m), 11.5 parts by weight of an acrylic binder, 0.5 part by weight of a dispersant and 53 parts by weight of alcohols composed of 1-butanol and ethanol.

(2) Next, the green sheets 400 were dried at 80° C. for 5 hours, and subsequently through holes, which would be conductor-filled through holes 41, and so on were made by punching.

(3) The following were mixed to prepare a conductor containing paste A: 100 parts by weight of tungsten carbide particles having an average particle diameter of 1 $\mu$m, 3.0 parts by weight of an acrylic binder, 3.5 parts by weight of α-terpineol solvent, and 0.3 part by weight of a dispersant. The following were mixed to prepare a conductor containing paste B: 100 parts by weight of tungsten particles having an average particle diameter of 3 $\mu$m, 1.9 parts by weight of an acrylic binder, 3.7 parts by weight of α-terpineol solvent, and 0.2 part by weight of a dispersant.

This conductor containing paste B was filled into the portions which would be conductor-filled through holes, so as to form a filled layer 410.

Twenty seven of the green sheets 400 subjected to the above-mentioned processing were laminated and pressed at 130° C. and a pressure of 8 MPa (reference to FIG. 8(a)).

(4) Next, the resultant lamination was degreased at 600° C. in the atmosphere of nitrogen gas for 5 hours and hot-pressed at 1890° C. and a pressure of 15 MPa for 10 hours to obtain an aluminum nitride sintered body having a thickness of 5 mm. This was cut off into a square, one side of which had a length of 60 mm, to prepare a ceramic board 42 having therein conductor-filled through holes 41 in a circular column form, which had a diameter of 200 $\mu$m.

(5) A sputtering equipment (CFS-RP-100 made by Tokuda Seisakusyo Co.) was used to sputter Ti, Mo and Ni in this order, so as to have thicknesses of 0.1 $\mu$m, 2.0 $\mu$m and 1.0 $\mu$m, respectively, on both surfaces of the ceramic board 42.

Furthermore, a resist was laminated thereon, and then exposed to light and developed to prepare an etching resist.

The resultant was subjected to etching treatment with an aqueous $HF/HNO_3$ solution having a temperature of 55° C., to form a conductor circuit 43 made of the Ti layer, the Mo layer and the Ni layer (reference to FIG. 8(b)).

(6) The ceramic board 42 was subjected to heating treatment, preparing for the coating, at 120° C. for 30 minutes Next, photosensitive polyimide (I-8802B made by Asahi Chemical Industry Co., Ltd.) was applied to the entire surface with a spin coater. The polyimide was heated and dried at 80° C. for 20 minutes, and then heated and cured at 350° C., to form a polyimide layer. Irregularities between the conductor circuit pieces were removed to make the surface flat.

(7) Furthermore, photosensitive polyimide (I-8802B made by Asahi Chemical Industry Co., Ltd.) was applied thereto with a spin coater. The polyimide was heated and dried at 80° C. for 20 minutes, and then a mask was placed thereon. The polyimide was exposed to light at 200 mJ, and developed with dimethyleneglycol diethyl ether (DMDG).

Furthermore, the polyimide was heated and post-baked at 350° C. to cure the imide layer.

(8) The same processing as in the step (7) was carried out to form an interlaminar resin insulating layer 44 made of polyimide (hereinafter referred to as the polyimide layer) having a thickness of 10 $\mu$m (reference to FIG. 8(c)). Openings for via holes, having a diameter of 100 $\mu$m, were made in this polyimide layer 44.

(9) The surface of the polyimide layer was treated with oxygen plasma. Furthermore, the surface was washed with 10% sulfuric acid.

(10) Next, the above-mentioned sputtering equipment was used to form a Cr layer of 0.1 $\mu$m thickness and a copper layer of 0.5 $\mu$m thickness in this order.

(11) Next, a resist film was laminated thereon, and exposed to light and developed to form a plating resist.

(12) Furthermore, a copper electroplating bath comprising 80 g/L of copper sulfate and 180 g/L of sulfuric acid and a nickel electroplating bath comprising 100 g/L of nickel sulfamic acid were used to subject the resultant to electroplating at a current density of 1 $A/dm^2$. In this way, a conductor wherein the thickness of copper was 5.5 $\mu$m and the thickness of Ni was 1 $\mu$m was formed.

(13) Furthermore, the plating resist was removed, and the Cr and Cu layers were removed with an aqueous solution of hydrochloric acid/water=2/1 (40° C.), so as to form a conductor circuit 48 containing via holes 46 (reference to FIG. 8(d)).

Furthermore, by repeating the steps (6) to (13), polyimide layers 144 and 244 as upper layers were formed, and conductor circuits 148 and 248 including via holes 146 and 246 were formed thereon. A polyimide layer 49 having openings 49a was formed thereon (reference to FIG. 8(e)).

(14) The resin surface was masked with a film to which an adhesive agent was applied, and subsequently a non-oxidizable metal film (not illustrated) composed of a Ni layer of 5 $\mu$m thickness and a Au layer of 0.03 $\mu$m thickness was formed, using a nickel electroless plating bath having a pH of 4.5 and consisting of $2.31 \times 10^{-2}$ mol/L of nickel chloride, $2.84 \times 10^{-2}$ mol/L of sodium hypophosphite and $1.55 \times 10^{-2}$ mol/L of sodium citrate, and a gold plating bath comprising $7.61 \times 10^{-3}$ mol/L of gold potassium cyanide, $1.87 \times 10^{-1}$ mol/L of ammonium chloride, $1.16 \times 10^{-1}$ mol/L of sodium citrate and $1.70 \times 10^{-1}$ mol/L of sodium hypophosphite, respectively In this probe card, the first and third layers were ground layers and the second layer was a signal layer.

EXAMPLE 2

Manufacture of a Probe Card (1) A composition made of 100 parts by weight of aluminum nitride powder (made by Tokuyama Corp., average particle diameter: 1.1 $\mu$m), 4 parts by weight of yttria ($Y_2O_3$, average particle diameter: 0.4 $\mu$m), 12 parts by weight of an acrylic binder, and an alcohol was spray-dried to produce granular powder.

(2) Next, this granular powder was put into a mold and formed into a flat plate form, thereby yielding a raw formed body (green). This raw formed body was pre-fired at 1400° C. The formed body subjected to this treatment was drilled to make through holes for conductor-filled through holes. The insides thereof were filled with the conductor containing paste B used in Example 1.

(3) The formed body subjected to the above-mentioned steps was cut off into a square, one side of which had a length of 60 mm, to prepare a ceramic board having therein conductor-filled through holes in a circular column form, which had a diameter of 200 μm.

(4) The sputtering equipment (CFS-RP-100 made by Tokuda Seisakusyo Co.) was used to sputter Ti, Mo and Ni in this order, so as to have thicknesses of 0.1 μm, 2.0 μm and 1.0 μm, respectively, on both surfaces of the ceramic board.

Furthermore, a resist was laminated thereon, and then exposed to light and developed to prepare an etching resist.

The resultant was subjected to etching treatment with an aqueous HF/HNO$_3$ solution having a temperature of 55° C., to form a conductor circuit made of the Ti layer, the Mo layer and the Ni layer.

(5) Next, a solution of a photosensitive cardo type polymer having a viscosity beforehand adjusted into 30 Pa·s was applied to the whole of one main face of the ceramic board by spin-coating. Thereafter, by drying the solution at a temperature of 150° C. for 20 minutes, a resin layer made of a half-cured film of the photosensitive cardo type polymer was formed.

The photosensitive cardo type polymer was a random copolymer obtained by reacting the bis-phenol fluorine hydroxyacrylate represented by the chemical formula (1) with bis-aniline fluorene of the above-mentioned general formula (3) wherein $R^2$, $R^3$, $R^4$, $R^5$ and $R^6$ were hydrogen atoms, and pyromellitic dianhydride at a molar ratio of 1:4:5, respectively.

Next, a photo etching mask wherein black circles were drawn in portions corresponding to openings for via holes was placed on the resin layer 440 made of the photosensitive cardo type polymer, and subsequently ultraviolet rays were applied thereto under a condition of 400 mj/cm$^2$, thereby performing exposure and development. In this way, openings for via holes were formed. Thereafter, the polymer was subjected to regular curing at 250° C. for 120 minutes, to form an interlaminar resin insulating layer. The thickness of the interlaminar resin insulating layer formed herein was 10 μm. The glass transition temperature of the interlaminar resin insulating layer was 260° C.

Thereafter, the surface of the interlaminar resin insulating layer was subjected to oxygen plasma treatment. The surface was then washed with 10% sulfuric acid.

(6) Next, the above-mentioned sputtering equipment was used to form a Cr layer of 0.1 μm thickness and a copper layer of 0.5 μm thickness in this order.

Next, a resist film was laminated thereon, and exposed to light and developed to form a plating resist.

(7) Next, copper electroplating was performed, using the above-mentioned thin film conductor layer as a plating lead, under the following conditions, so as to form a copper electroplating layer on portions where the plating resist was not formed.

| [Copper electroplating solution] | |
| --- | --- |
| Sulfuric acid | 2.24 mol/L |
| Copper sulfate | 0.26 mol/L |
| Additive (Caparacide HL, made by Atotch Japan K.K.) | 19.5 mL/L |

| [Electroplating conditions] | |
| --- | --- |
| Current density | 1 A/dm$^2$ |
| Time | 65 minutes |
| Temperature | 22° C. ± 2° C. |

(8) Furthermore, a nickel electroplating bath containing 100 g/L of nickel sulfamic acid was used to perform electroplating at a current density of 1 A/dm$^2$ to form a conductor made of copper of 5.5 μm thickness and Ni of 1 μm thickness.

(9) Furthermore, the plating resist was removed and the Cr and Cu layers were removed with an aqueous solution of hydrochloric acid/water=2/1 (40° C.), to form a conductor circuit including terminal pads (50 μm□) and via holes.

(10) Next, by repeating the steps described in the steps (5) to (9), an interlaminar resin insulating layer and a conductor circuit (including via holes), as higher layers, were formed. Subsequently, by repeating the step described in the above-mentioned step (5), a topmost resin layer having openings was formed.

(13) Next, the resin surface was masked with a film to which an adhesive agent was applied, and subsequently a non-oxidizable metal film (not illustrated) composed of a Ni layer of 5 μm thickness and a Au layer of 0.03 μm thickness was formed, using a nickel electroless plating bath having a pH of 4.5 and comprising 2.31×10$^{-2}$ mol/L of nickel chloride, 2.84×10$^{-2}$ mol/L of sodium hypophosphite and 1.55×10$^{-2}$ mol/L of sodium citrate, and a gold plating bath comprising 7.61×10$^{-3}$ mol/L of gold potassium cyanide, 1.87×10$^{-1}$ mol/L of ammonium chloride, 1.16×10$^{-1}$ mol/L of sodium citrate and 1.70×10$^{-1}$ mol/L of sodium hypophosphite, respectively. In this way, a probe card was obtained. In this probe card, the first and third layers were ground layers and the second layer was a signal layer.

EXAMPLE 3

(1) A composition made of 100 parts by weight of SiC powder (average particle diameter: 0.5 μm), 0.5 part by weight of C (average particle diameter: 0.4 μm), 12 parts by weight of an acrylic resin binder, and an alcohol was spray-dried to produce granular powder.

(2) The granular powder was put into a mold and formed into a flat plate form, thereby yielding a raw formed body (green). This raw formed body was sintered at 1900° C. under a pressure of 20 MPa, to yield a ceramic board having a diameter of 310 mm.

Next, a glass paste (G-5177 made by Shoei Chemical Industry Co., Ltd.) was applied to the surface, and the ceramic board was fired at 700° C., to form a coating layer of 2 μm thickness on the surface.

(3) The sputtering equipment (CFS-RP-100 made by Tokuda Seisakusyo Co.) was used to sputter Ti, Mo and Ni in this order, so as to have thicknesses of 0.1 μm, 2.0 μm and 1.0 μm, respectively, on both surfaces of the ceramic board.

Furthermore, a resist was laminated thereon, and then exposed to light and developed to prepare an etching resist.

The resultant was subjected to etching treatment with an aqueous HF/HNO$_3$ solution having a temperature of 55° C., to form a conductor circuit made of the Ti layer, the Mo layer and the Ni layer.

(4) Next, a solution of a photosensitive cardo type polymer having a viscosity beforehand adjusted into 30 Pa·s was applied to the whole of a main face of the ceramic board by spin-coating. Thereafter, by drying the solution at a temperature of 150° C. for 20 minutes, a resin layer made of a half-cured film of the photosensitive cardo type polymer was formed.

The photosensitive cardo type polymer used herein was a random copolymer obtained by reacting the bis-phenol fluorine hydroxyacrylate represented by the chemical formula (1) with bis-aniline fluorene of the above-mentioned general formula (3) wherein $R^2$, $R^3$, $R^4$, $R^5$ and $R^6$ were hydrogen atoms, and pyromellitic dianhydride at a molar ratio of 1:4:5, respectively.

(5) Next, a photo etching mask wherein black circles were drawn in portions corresponding to openings for via holes was placed on the resin layer 440 made of the above-mentioned photosensitive cardo type polymer, and subsequently ultraviolet rays were applied thereto under a condition of 400 mj/cm$^2$, thereby performing exposure and development. In this way, openings for via holes were formed. Thereafter, the polymer was subjected to regular curing at 250° C. for 120 minutes, to form an interlaminar resin insulating layer. The thickness of the interlaminar resin insulating layer formed herein was 10 µm. The glass transition temperature of the interlaminar resin insulating layer was 260° C.

Thereafter, the surface of the interlaminar resin insulating layer was subjected to oxygen plasma. The surface was then washed with 10% sulfuric acid.

(6) Next, the above-mentioned sputtering equipment was used to form a Cr layer of 0.1 µm thickness and a copper layer of 0.5 µm thickness in this order.

Next, a resist film was laminated thereon, and exposed to light and developed to form a plating resist.

(7) Next, copper electroplating was performed, using the above-mentioned thin film conductor layer as a plating lead, under the following conditions, so as to form a copper electroplating layer on portions where the plating resist was not formed.

| [Copper electroplating solution] | |
|---|---|
| Sulfuric acid | 2.24 mol/L |
| Copper sulfate | 0.26 mol/L |
| Additive (Caparacide HL, made by Atotech Japan K.K.) | 19.5 mL/L |

| [Electroplating conditions] | |
|---|---|
| Current density | 1 A/dm$^2$ |
| Time | 65 minutes |
| Temperature | 22° C. ± 2° C. |

(8) Furthermore, a nickel electroplating bath containing 100 g/L of nickel sulfamic acid was used to perform electroplating at a current density of 1 A/dm$^2$ to form a conductor made of copper of 5.5 µm thickness and Ni of 1 µm thickness.

(9) Furthermore, the plating resist was removed and the Cr and Cu layers were removed with an aqueous solution of hydrochloric acid/water=2/1 (40° C.), to forma conductor circuit including terminal pads (50 µm□) and via holes.

(10) Next, by repeating the steps described in the steps (5) to (9), an interlaminar resin insulating layer and a conductor circuit (including via holes), as higher layers, were formed. Subsequently, by repeating the step described in the above-mentioned step (5), a topmost resin layer having openings was formed.

(11) Next, the resin surface was masked with a film to which an adhesive agent was applied, and subsequently a non-oxidizable metal film (not illustrated) composed of a Ni layer of 5 µm thickness and a Au layer of 0.03 µm thickness was formed, using a nickel electroless plating bath having a pH of 4.5 and comprising 2.31×10$^{-2}$ mol/L of nickel chloride, 2.84×10$^{-2}$ mol/L of sodium hypophosphite and 1.55×10$^{-2}$ mol/L of sodium citrate, and a gold plating bath comprising 7.61×10$^{-3}$ mol/L of gold potassium cyanide, 1.87×10$^{-1}$ mol/L of ammonium chloride, 1.16×10$^{-1}$ mol/L of sodium citrate and 1.70×10$^{-1}$ mol/L of sodium hypophosphite, respectively. In this way, a probe card was obtained.

(12) Furthermore, photosensitive polyimide was applied onto the conductor circuit including the pads, and the polyimide was exposed to light and developed to make pad portions exposed. In this way, a probe card was manufactured.

In this probe card, the first and third layers were ground layers and the second layer was a signal layer.

TEST EXAMPLE 1

A paste obtained by mixing 100 parts by weight of alumina powder (average particle diameter: 1.0 µm), 11.5 parts by weight of an acrylic binder, 0.5 part by weight of a dispersant and 53 parts by weight of alcohols composed of 1-butanol and ethanol was used to conduct formation by a doctor blade method, to obtain green sheets 400 having a thickness of 0.47 mm. The green sheets were laminated and fired at 1600° C. to manufacture a ceramic board having conductor-filled through holes. Furthermore, photosensitive polyimide was printed on the substrate except the periphery thereof. In the same way as in Example 1 except the above-mentioned operation, a probe card was manufactured.

COMPARATIVE EXAMPLE 1

(1) A paste obtained by mixing 100 parts by weight of alumina powder (average particle diameter: 1.0 µm), 11.5 parts by weight of an acrylic binder, 0.5 part by weight of a dispersant and 53 parts by weight of alcohols composed of 1-butanol and ethanol was used to conduct formation by a doctor blade method, to obtain green sheets 400 having a thickness of 0.47 mm. The green sheets were laminated and then fired at 1600° C. to manufacture a ceramic board having conductor-filled through holes.

(2) The sputtering equipment (CFS-RP-100 made by Tokuda Seisakusyo Co.) was used to sputter Ti, Mo and Ni in this order, so as to have thicknesses of 0.1 µm, 2.0 µm and 1.0 µm, respectively, on both surfaces of the ceramic board.

Furthermore, a resist was laminated thereon, and then exposed to light and developed to prepare an etching resist.

The resultant was subjected to etching treatment with an aqueous HF/HNO$_3$ solution having a temperature of 55° C., to form a conductor circuit made of the Ti layer, the Mo layer and the Ni layer.

Each of the probe cards according to Examples 1 to 3, Test Example 1 and Comparative Example 1 was set to the inspecting device illustrated in FIG. 1. One hundred silicon wafers which were beforehand judged as acceptable products were used, and the temperature of the silicon wafers was raised to 150° C. and subsequently the temperature was cooled to −50° C. This step was repeated to inspect the operating condition of integrated circuits formed in the silicon wafer.

In the inspecting device using each of the probe cards according to Examples 1 to 3, all of the products (silicone wafers) were judged as acceptable products even at high temperature or low temperature in the one hundred times inspections. Thus, it was demonstrated that the contact of the probes 52 of the contactor substrate 50 with the exposed conductor circuit 248 of the probe card 40 was good even at high temperature or low temperature. Accordingly, it is presumed that the interlaminar resin insulating layers formed on the ceramic board 42 expand and contract repeatedly at the same ratio, following thermal expansion and contraction of the ceramic board 42.

On the other hand, in the probe cards according to Test Example 1 and Comparative Example 1, the silicon wafers were judged as unacceptable products, and it was found that at high temperature the inspecting device made erroneous decisions at a high probability. It can be considered that this results from the fact that the contact of the probes 52 of the contactor substrate 50 with the exposed conductor circuit of the probe card was poor at high temperature or low temperature because of a large thermal expansion coefficient of alumina.

A warp was generated in these probe cards. It is presumed that this is also one of causes for the poor contact. It is presumed that the generation of the warp resulted from the fact that the resin layer was not formed on the entire surface of the ceramic board.

Furthermore, Examples 1 to 3, Test Example 1 and Comparative Example 1 were tested using signals having a high frequency band of 1 GHz at 150° C. As a result thereof, in Examples 1 to 3, decisions could be made without any problem. In Test Example, no decision was able to be made because of the warp. In Comparative Example 1, no measurement was able to be made since the waveform of the signals was distorted.

INDUSTRIAL APPLICABILITY

As described above, according to the present invention, a probe card is formed by laminating a resin thin film on a ceramic board; therefore, the thermal expansion coefficient of the probe card is equal to that of a silicon wafer. For this reason, at the time of heating or cooling the silicon wafer, the probe card contracts thermally in the same way as the silicon wafer does. As a result, the probe does not slip off from sites to be inspected of the silicon wafer, and an appropriate inspection can be made since no warp is generated. Additionally, the number of pads is easily increased and impedance matching is easily attained; therefore, inspection using signals having a high frequency can be performed.

What is claimed is:

1. An inspecting device equipped with:
a performance substrate provided with a terminal for inspection;
a contactor substrate provided with a probe contacting an object to be inspected; and
a probe card,
wherein said probe card is a multi-layered substrate in which a resin thin film is laminated on a ceramic board.

2. The inspecting device according to claim 1,
wherein the ceramic board of said probe card comprises non-oxide ceramic.

3. The inspecting device according to claim 1,
wherein said resin thin film comprises thermosetting resin.

4. The inspecting device according to claim 2,
wherein said resin thin film comprises thermosetting resin.

5. An inspecting device equipped with:
a performance substrate provided with a terminal for inspection;
a contactor substrate provided with a probe contacting an object to be inspected; and
a probe card intervening between said probe of said contactor substrate and said terminal of said performance substrate,
wherein said probe card is a multi-layered substrate in which a resin thin film is laminated on a ceramic board.

6. The inspecting device according to claim 5,
wherein the ceramic board of said probe card comprises non-oxide ceramic.

7. The inspecting device according to claim 6,
wherein said resin thin film comprises thermosetting resin.

8. The inspecting device according to claim 5,
wherein said resin thin film comprises thermosetting resin.

9. An inspecting device equipped with:
a performance substrate provided with a terminal for inspection;
a contactor substrate provided with said probe contacting an object to be inspected; and
a probe card electrically connected to said probe of said contactor substrate,
said inspecting device being constituted such that the object to be inspected is placed between said performance substrate and said probe card,
wherein said probe card is a multi-layered substrate in which a resin thin film is laminated on a ceramic board.

10. The inspecting device according to claims 9, wherein the ceramic board of said probe card comprises non-oxide ceramic.

11. The inspecting device according to claim 10,
wherein said resin thin film comprises thermosetting resin.

12. The inspecting device according to claim 9,
wherein said resin thin film comprises thermosetting resin.

* * * * *